United States Patent
Chakraborty et al.

(10) Patent No.: US 10,249,380 B2
(45) Date of Patent: Apr. 2, 2019

(54) EMBEDDED MEMORY TESTING WITH STORAGE BORROWING

(71) Applicant: QUALCOMM Incorporated, San Diego, CA (US)

(72) Inventors: Tapan Jyoti Chakraborty, San Diego, CA (US); Roberto Fabian Averbuj, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 20 days.

(21) Appl. No.: 15/418,543

(22) Filed: Jan. 27, 2017

(65) Prior Publication Data

US 2018/0218778 A1  Aug. 2, 2018

(51) Int. Cl.
| | |
|---|---|
| *G11C 29/12* | (2006.01) |
| *G01R 31/28* | (2006.01) |
| *G11C 29/02* | (2006.01) |
| *G11C 29/04* | (2006.01) |
| *G11C 29/38* | (2006.01) |
| *G11C 29/44* | (2006.01) |
| G11C 29/32 | (2006.01) |

(52) U.S. Cl.
CPC ...... *G11C 29/1201* (2013.01); *G01R 31/2856* (2013.01); *G11C 29/022* (2013.01); *G11C 29/04* (2013.01); *G11C 29/38* (2013.01); *G11C 29/44* (2013.01); *G11C 29/32* (2013.01); *G11C 2029/0401* (2013.01); *G11C 2029/1208* (2013.01); *G11C 2029/3202* (2013.01)

(58) Field of Classification Search
None
See application file for complete search history.

(56) References Cited

U.S. PATENT DOCUMENTS

| | | | | |
|---|---|---|---|---|
| 4,780,874 A | * | 10/1988 | Lenoski | G01R 31/318552 714/726 |
| 4,799,220 A | * | 1/1989 | Nielsen | G01R 31/31919 714/32 |
| 5,048,019 A | | 9/1991 | Albertsen | |
| 5,680,544 A | | 10/1997 | Edmondson et al. | |
| 5,691,990 A | * | 11/1997 | Kapur | G01R 31/318586 714/30 |

(Continued)

OTHER PUBLICATIONS

Mukherjee N., et al., "High Volume Diagnosis in Memory BIST Based on Compressed Failure Data," IEEE transactions on Computer-Aided Design of Integrated Circuits and Systems, Mar. 2010, vol. 29, No. 3, pp. 441-453.

(Continued)

*Primary Examiner* — Steve N Nguyen
(74) *Attorney, Agent, or Firm* — Colby Nipper / Qualcomm

(57) ABSTRACT

An integrated circuit (IC) is disclosed herein for embedded memory testing with storage borrowing. In an example aspect, an integrated circuit includes a functional logic block, a memory block, and test logic. The functional logic block includes multiple storage units and is configured to store functional data in the multiple storage units during a regular operational mode. The test logic is configured to perform a test on the memory block during a testing mode. The test logic is also configured to retain memory test result data in the multiple storage units of the functional logic block during the testing mode.

24 Claims, 12 Drawing Sheets

(56) References Cited

U.S. PATENT DOCUMENTS

| | | | |
|---|---|---|---|
| 6,728,915 B2* | 4/2004 | Whetsel | G01R 31/318536 714/727 |
| 8,259,522 B1 | 9/2012 | Dastidar et al. | |
| 8,898,530 B1 | 11/2014 | Douskey et al. | |
| 9,384,856 B2 | 7/2016 | Spruth et al. | |
| 2003/0074619 A1 | 4/2003 | Dorsey | |
| 2003/0204783 A1 | 10/2003 | Kuroda | |
| 2005/0193293 A1 | 9/2005 | Shikata | |
| 2005/0262401 A1 | 11/2005 | Saitou | |
| 2006/0041807 A1* | 2/2006 | Terai | G01R 31/318594 714/733 |
| 2006/0236035 A1 | 10/2006 | Barlow et al. | |
| 2007/0150777 A1 | 6/2007 | Sasaki | |
| 2007/0260950 A1 | 11/2007 | Morrison et al. | |
| 2011/0055646 A1 | 3/2011 | Mukherjee et al. | |
| 2013/0198578 A1* | 8/2013 | Chandel | G01R 31/3172 714/727 |
| 2015/0100840 A1* | 4/2015 | Sanghani | G01R 31/3177 714/726 |

OTHER PUBLICATIONS

International Search Report and Written Opinion—PCT/US2017/064381—ISA/EPO—dated Feb. 19, 2018.

* cited by examiner

EMBEDDED MEMORY TESTING WITH STORAGE BORROWING

TECHNICAL FIELD

This disclosure relates generally to integrated circuit (IC) testing and, more specifically, to embedded testing of a memory in an integrated circuit by borrowing from other storage within the integrated circuit to retain memory test data resulting from the embedded testing procedure.

BACKGROUND

The operation of a computing device, such as a web server or a smart phone, is based on integrated circuits that serve as the brains of such computing devices. Thus, integrated circuits can enable web page delivery, application usage, video game playing, media streaming, participation in electronic communications, and so forth. To do so, integrated circuits execute instructions that form computer programs. These computer programs are long and complex, and execution of such computer programs demands integrated circuits that are likewise complex.

Integrated circuits execute computer programs using transistors, which individually function as switches. A number of such switches are typically required to form even a single circuit device, and numerous circuit devices are employed to execute even the simplest of program instructions. Consequently, to handle today's long computer programs with complex instructions, modern integrated circuits can have hundreds of millions of transistors. Like any other complex machine having a multitude of interoperating parts, integrated circuits may not be manufactured correctly. An integrated circuit can have a defect that results, for example, from a fault in the foundational material, or substrate, of the integrated circuit or from a fault in the fabrication process of just a single transistor among the hundreds of millions of transistors.

To identify defective integrated circuits before incorporating them into a computing device, integrated circuits can be tested, especially during the initial design, debugging, and production processes. More specifically, after integrated circuit chips are fabricated, the integrated circuits are tested to ensure that each one will ultimately work reliably and in accordance with design specifications. Originally, integrated circuit testing was performed exclusively by external automated testing equipment (ATE). Generally, ATE provides inputs to an integrated circuit chip and receives outputs from the integrated circuit chip. The ATE then analyzes the actual received outputs with regard to correct or expected outputs.

Unfortunately, using external ATE to test an integrated circuit has become increasingly slow because a single integrated circuit chip can include hundreds of millions of transistors allocated across numerous different logical blocks. This problem is especially relevant for a system-on-a-chip (SOC), which incorporates multiple different processing functionalities on a single chip. Although the number of transistors on a chip has increased dramatically by shrinking the size of each transistor, an equivalent shrinkage in the size of input/output (I/O) pads or pins has not occurred. The size of the input/output pads for an integrated circuit chip, and therefore the number of such pads that are available for input/output signaling, are therefore more constrained by physical limitations.

Moreover, there is an increasingly greater divide separating the amount of on-chip processing capabilities provided by a given integrated circuit from the ability to move data into or out of the chip via the limited number of input/output pads. As a result, given the relatively fewer number of input/output pads available per integrated circuit chip relative to the multitude of circuit devices that are to be tested within a single SOC, external testing alone can be extraordinarily time consuming. This time consumed by external testing involves people, testing equipment, space within a fabrication or testing facility, and other manufacturing resources. The extended testing time can therefore add significant costs as well as delays to integrated circuit production.

To accommodate the divergence between the number of on-chip circuit devices and the number of available input/output pads, internal testing of integrated circuit chips has been developed. This on-chip testing is referred to as built-in self-test (BIST) technology. On-chip BIST logic is capable of applying testing algorithms on different blocks of an integrated circuit while at least largely avoiding the input/output bottleneck that would be faced by external ATE executing the same testing algorithm. However, even using BIST logic, the results of applying a testing algorithm are still reported external to the integrated circuit chip. As the number of transistors on an integrated circuit chip continues to increase and as the number of detected failures increases accordingly, the bottleneck between internal processing capabilities and access to external input/output pins has again become a problem, even with BIST technology.

In other words, with the exceedingly large number of circuit devices that are to be tested on an integrated circuit, the number of detected failures has also become exceedingly large. To properly diagnose design or other systemic flaws in an integrated circuit chip, the information characterizing such detected failures is reported external to the chip for in-depth analysis. Consequently, the reporting of testing failures remains problematic with conventional approaches to integrated circuit testing.

SUMMARY

An integrated circuit (IC) is disclosed herein for embedded memory testing with storage borrowing. In an example aspect, an integrated circuit includes a functional logic block, a memory block, and test logic. The functional logic block includes multiple storage units and is configured to store functional data in the multiple storage units during a regular operational mode. The test logic is configured to perform a test on the memory block during a testing mode. The test logic is also configured to retain memory test result data in the multiple storage units of the functional logic block during the testing mode.

In an example aspect, an integrated circuit is disclosed. The integrated circuit includes a functional logic block, a memory block, and test logic. The functional logic block is configured to implement processing functionality during a regular operational mode. The functional logic block includes storage means for storing functional data during the regular operational mode. The memory block is configured to hold operational data during the regular operational mode. The test logic is configured to perform a test on the memory block to generate memory test result data during a testing mode. The test logic includes control means for retaining the memory test result data during the testing mode using the storage means.

In an example aspect, a method for borrowing storage for embedded memory testing is disclosed. The method includes providing, to a memory block, input test data as part of a memory testing procedure. The method also includes obtaining, from the memory block, output test data responsive to the input test data and based on the memory testing procedure. The method additionally includes detecting a memory location failure based on the output test data, with the memory location failure characterized by memory test result data. The method further includes storing the memory test result data in a register of a functional logic block during the memory testing procedure.

In an example aspect, an integrated circuit is disclosed. The integrated circuit includes multiple flip-flops, a functional logic block, a memory block, and test logic. Each flip-flop of the multiple flip-flops is configurable to store one bit of data as part of a register of multiple registers. The functional logic block is configured to implement processing functionality and to store functional data for the processing functionality in the multiple flip flops during a regular operational mode. The memory block is configured to hold operational data for the functional logic block during the regular operational mode. The test logic includes memory test circuitry that is configured to perform a test on the memory block during a testing mode and to generate memory test result data responsive to detection of a memory location failure based on the test. The memory test circuitry is also configured to retain the memory test result data in the multiple flip-flops as actuated into the register during the testing mode.

DETAILED DESCRIPTION

Figure 1:
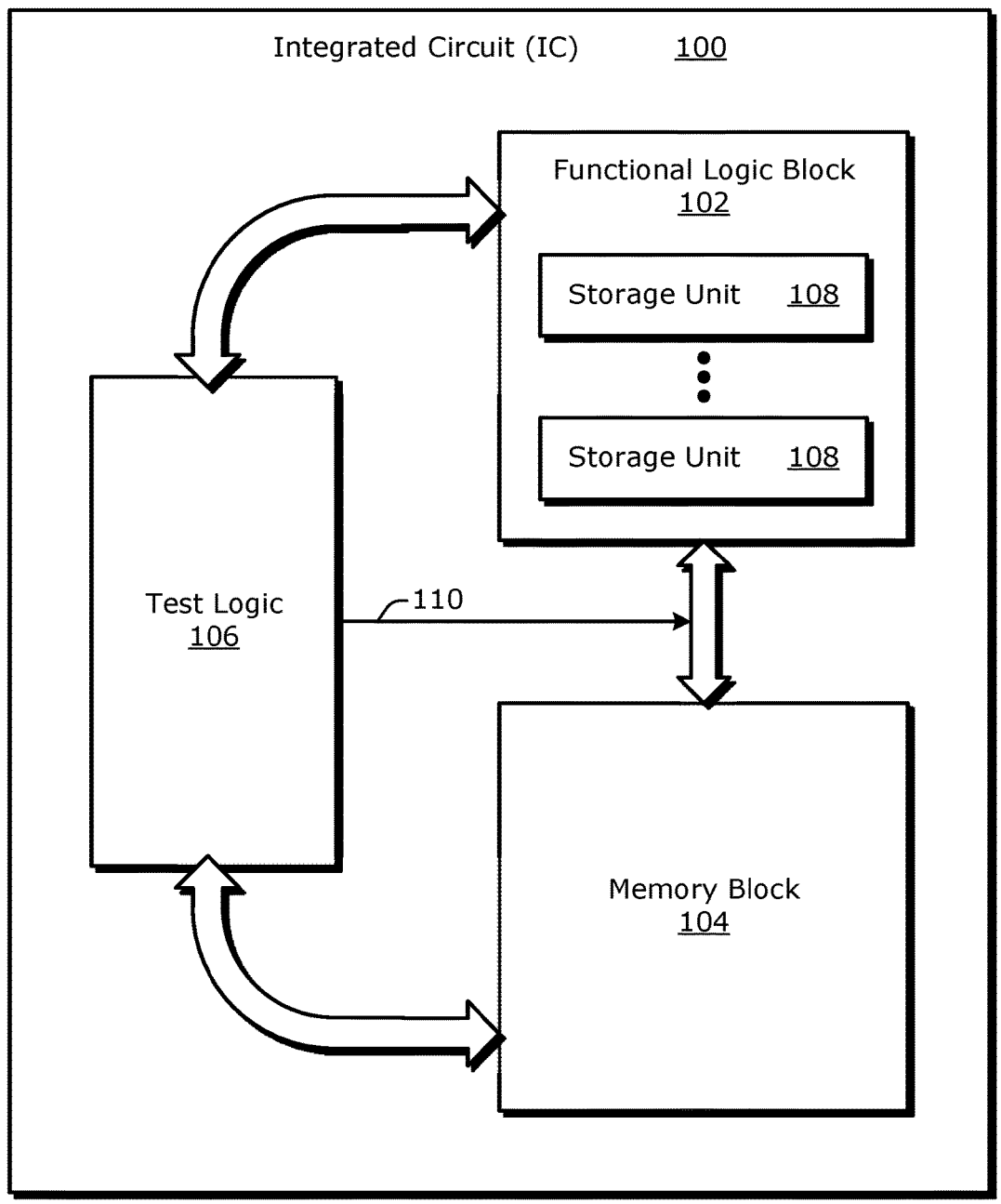
FIG. 1 depicts an example integrated circuit including test logic and multiple blocks.

In contrast with conventional approaches to integrated circuit testing, implementations that are described herein can efficiently handle the reporting of testing failures. Described implementations include embedded test logic that can perform a test on a memory of an integrated circuit. Information characterizing a testing failure of the memory is temporarily stored using storage units that are borrowed from functional logic. For example, flip-flops that are used by a functional logic block during a regular operational mode are repurposed into registers for storing memory test result data during a testing mode.

With conventional approaches to using built-in self-test (BIST) technology for integrated circuits, the reporting of a failure condition is expensive from multiple perspectives. Failure condition reporting is expensive in part because of the input/output bottleneck between the vast number of circuit devices that are internal to a chip and the relatively few data input/output pins that can be coupled to the chip. In operation, BIST logic performs a testing procedure on a portion of an integrated circuit, such as a memory block, and produces failure conditions. Conventional reporting of these failure conditions is expensive in terms of testing time or spatial area of the integrated circuit.

In one conventional approach, performance of a testing procedure is stopped at each detected failure, or after just a few detected failures, so that the failure condition can be reported before any additional failures are detected. Thus, the testing procedure is paused prior to completion of a testing algorithm to enable the reporting of the failure condition. In these cases, the reporting is expensive from a time perspective because continuing the testing procedure involves restarting the testing algorithm from the beginning to ensure that no aspect of the test is inadvertently omitted. More specifically, to test a memory, an exacting sequence of a number of different memory accessing operations are applied to the memory as part of a carefully-designed and thorough testing algorithm. When the exacting sequence is interrupted to report a failure, the sequence is restarted to ensure that the memory is tested properly and thoroughly in accordance with the testing algorithm.

On the other hand, in another conventional approach, an integrated circuit chip is manufactured to include sufficient extra memory space in the BIST logic to retain failure information until a testing algorithm is completed. In these cases, the ability to report multiple retained failure conditions after completion of the testing procedure is expensive from the perspective of the chip area occupied by the extra memory space. This is especially true for the testing of an on-chip memory block in which each addressable memory location—of potentially billions of such memory locations—is to be tested and individual failed memory locations are to be individually reported. Thus, conventional approaches to implementing BIST logic are expensive in terms of time or spatial area on a chip.

To address the above problems, a memory BIST (MBIST) mechanism is described herein that is capable of using registers that are part of functional logic. The registers, which are exclusive of the memory being tested, store failure condition information resulting from a memory testing procedure. Thus, no additional memory needs to be added to a system-on-a-chip (SOC) or other integrated circuit chip to store the failure condition information during the memory testing procedure. Furthermore, execution of a testing algorithm for each memory block can be completed prior to reporting multiple instances of failure condition information. Thus, there is no need to restart execution of a testing algorithm after the reporting of each detected failure condition.

In some example implementations, an integrated circuit includes a functional logic block, a memory block, and test logic. Some processing functionality, such as modem or video processing, can be implemented by the functional logic block. The functional logic block includes multiple storage units, such as multiple flip-flops. The functional logic block is capable of using these multiple flip-flops to store functional data during a regular operational mode. However, these multiple flip-flops are repurposed by the test logic during a testing mode.

The test logic actuates the multiple flip-flops into multiple different registers. The test logic includes scan test circuitry and memory test circuitry. The scan test circuitry first tests the registers to ensure that the registers can be used to reliably store functional data during a regular operational mode and reliably retain failure condition information during a memory test procedure of a testing mode. After the registers have been scan tested, the memory test circuitry performs a test on the memory block. Generally, the memory test circuitry writes input test data and reads output test data for each memory location of the memory block. If the output test data fails to match expected output data for a given memory location, a failure condition is detected for the given memory location.

For each detected failure at a given memory location, the memory test circuitry produces memory test result data. The memory test result data can include an address of the failed memory location, the output test data, and an operation indication of the memory task (e.g., a sequence of memory accesses) that resulted in the memory location failure. To borrow a register of the multiple registers during the testing mode, the memory test circuitry transfers the memory test result data into a register of the functional logic block. In an example circuit arrangement to realize a register that can be borrowed, one additional multiplexer is added for each flip-flop in a register to enable this data transfer. The register retains the memory test result data for each memory location failure during the testing mode. The memory test circuitry can therefore continue performing the testing algorithm on the memory block without interruption and without using additional registers that are reserved solely for capturing memory test result data (e.g., memory fail signatures) during the memory test. At the conclusion of the testing algorithm, the test logic causes the retained memory test result data to be exposed external to the integrated circuit chip. For example, the test logic can cause the memory test result data to be scanned out from the registers or read out functionally from the registers using register-specific addressing.

In these manners, memory blocks of an integrated circuit can be tested while memory test result data is handled efficiently. By using embedded, on-chip storage, an entire memory testing algorithm can be performed without interruption. This avoids restarting the memory testing algorithm after each detected memory location failure. By borrowing storage units from a functional block that is otherwise uninvolved in a memory testing procedure, the uninterrupted memory testing algorithm is accomplished with little additional circuitry being added to the integrated circuit.

FIG. 1 depicts an example integrated circuit 100 including test logic 106 and multiple blocks. Two example blocks are shown: a functional logic block 102 and a memory block 104. The functional logic block 102 includes multiple storage units 108. A control signal 110 is also shown. Although a single functional logic block 102 and a single memory block 104 are explicitly depicted, an integrated circuit 100 can include multiple ones of either such blocks. Similarly, multiple instances of test logic 106 can be disposed on an integrated circuit 100, can be distributed or arranged in different layouts, and so forth.

The functional logic block 102 implements at least one processing functionality. Examples of processing functionality include video or other graphics processing, modem or other communication processing, encryption or other security processing, core compute processing, power management processing, or some combination thereof. Other examples of processing functionality or corresponding circuitry blocks, including those for a system-on-a-chip (SOC), are described below with reference to FIG. 12.

The multiple storage units 108 can be physically co-located with the functional logic block 102 on the integrated circuit 100 or disposed physically separate from, while remaining logically associated with, the functional logic block 102. The functional logic block 102 stores functional data in the multiple storage units 108 in a regular operational mode (e.g., a non-testing mode). Functional data includes at least data that supports the performance of the processing functionality implemented by the functional logic block 102. Functional data typically, but not exclusively, pertains to information or instructions that are currently being operated on, to temporary data, or to data that is in transit between processing areas. In an example implementation, a storage unit 108 comprises one or more flip-flops or at least one register. More specifically, a storage unit 108 can be formed by actuating multiple flip-flops into a register that can store multiple bits of data. Example flip-flop and register-based implementations for a storage unit 108 are described below with reference to FIGS. 7 and 9.

The memory block 104 stores program information, instructions, or other data in a bulk format. Examples of the memory block 104 include random access memory (RAM), dynamic RAM (DRAM), static RAM (SRAM), flash memory, cache memory, graphics memory, and combinations thereof. More specifically, the memory block 104, such as an array of RAM, can hold operational data during a regular operational mode on behalf of, under the control of, or for the functional logic block 102. Operational data includes, for example, executable instructions, program data, user data, and combinations thereof. The memory block 104 can be disposed at one physical location of the integrated circuit 100 (as shown), distributed at different locations around the integrated circuit 100, arranged into a different geometric shape (instead of the depicted rectangle), some combination thereof, and so forth.

The integrated circuit 100 can operate in a regular operational mode or a testing operating mode. In the regular operational mode, the functional logic block 102 can use the memory block 104 to support the realization of some processing functionality, such as by causing the memory block 104 to hold operational data. In the testing mode, the test logic 106 performs one or more testing procedures on the functional logic block 102 or the memory block 104. As described herein, the test logic 106 borrows the multiple storage units 108 to facilitate efficient performance of a test on the memory block 104. To do so, some memory test result data is retained in the multiple storage units 108 during a testing procedure. Any communication between the memory block 104 and the functional logic block 102 during the testing mode can be caused or coordinated by the test logic 106 as indicated by the control signal 110. Examples of the regular operational mode and the testing mode are described with reference to FIG. 2.

Figure 2:
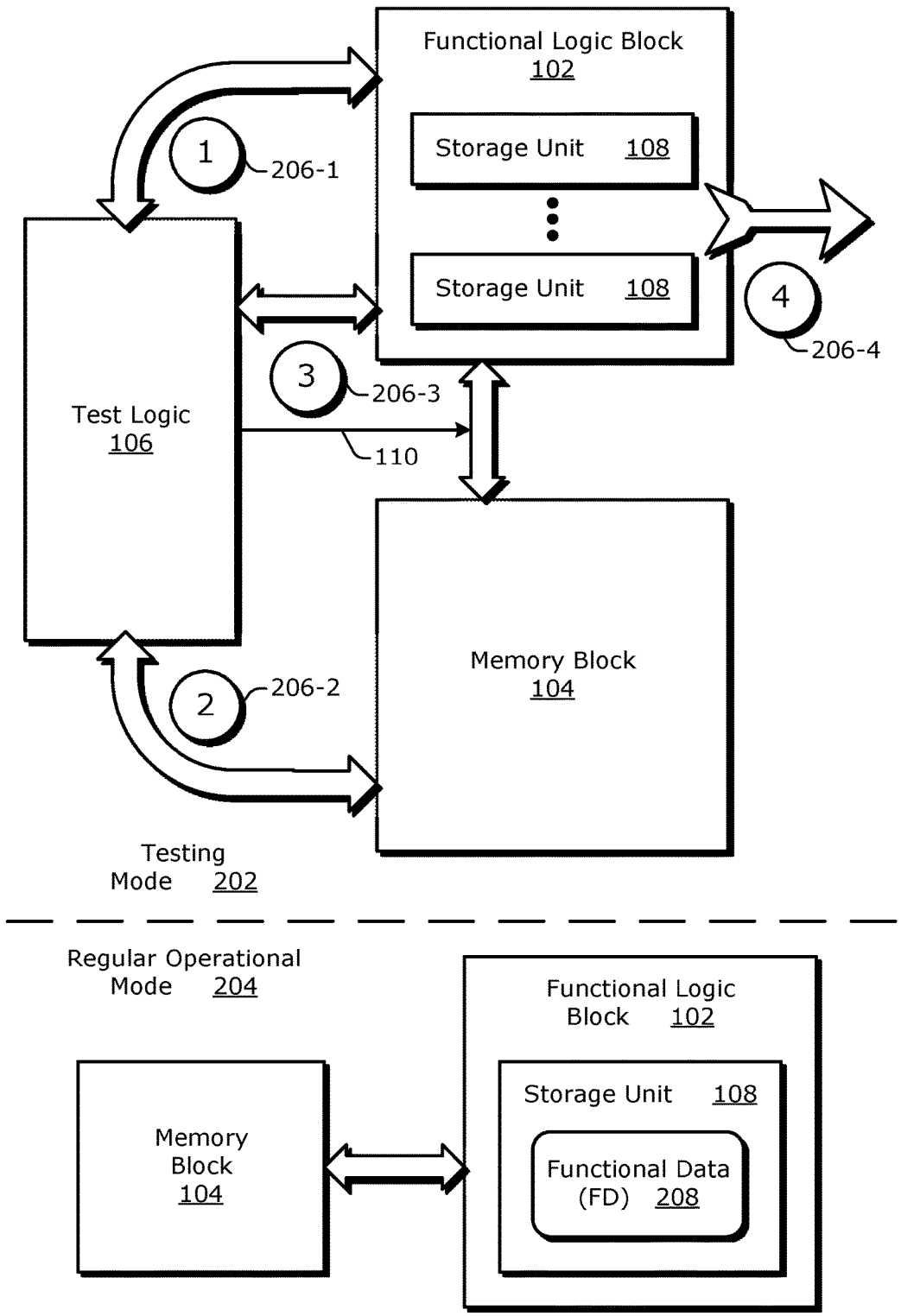
FIG. 2 illustrates example interactions among the test logic, a functional logical block, and a memory block.

FIG. 2 illustrates example interactions 200 among the test logic, the functional logical block 102, and the memory block 104. The interactions 200 are separated into a testing mode 202 and a regular operational mode 204. In the top portion of FIG. 2, in the testing mode 202, four phases 206 are indicated with encircled numerals. In a first phase 206-1, the test logic 106 performs a test on the storage units 108 of the functional logic block 102. This testing ensures that the storage units 108 can work reliably to store functional data 208 during the regular operational mode 204 and can also reliably retain memory test result data associated with the memory block 104 during the testing mode 202. Example implementations for the first phase 206-1 are described below with reference to FIG. 3. In a second phase 206-2, the test logic 106 performs a test on the memory block 104. Example implementations for the second phase 206-2 are described below with reference to FIG. 4.

In a third phase 206-3, the test logic 106 causes memory test result data to be transferred to the storage units 108 to enable the memory test result data to be retained during the testing mode 202. At least a portion of the memory test result data can be transferred directly from the memory block 104 to the storage units 108 of the functional logic block 102 under direction of the test logic 106 as indicated by the control signal 110. Alternatively, a portion of the memory test result data that originates from the memory block 104 can be transferred indirectly to the storage units 108 via the test logic 106. Example implementations for the third phase 206-3, in conjunction with aspects of the second phase 206-2, are described below with reference to FIG. 5. In a fourth phase 206-4, the test logic 106 causes the memory test result data to be extracted or output from the storage units 108 of the functional logic block 102. The extracted memory test result data can be presented on input/output pads for acquisition by external automated testing equipment (ATE) or other diagnostic equipment. The outputting of memory test result data from storage units 108 after completion of a memory testing procedure is described below with reference to FIG. 7.

The bottom portion of FIG. 2 is directed to the regular operational mode 204. In the regular operational mode 204, the functional logic block 102 implements designated processing functionality, such as graphics processing. In the course of such functional processing, the functional logic block 102 stores functional data 208 (FD) in one or more of the storage units 108 that were used to retain memory test result data during the testing mode 202. In these manners, the multiple storage units 108 of the functional logic block 102 are capable of serving two different purposes during the lifespan of the integrated circuit. A first purpose is to retain memory test result data during the testing mode 202. A second purpose is to hold the functional data 208 during the regular operational mode 204.

Figure 3:
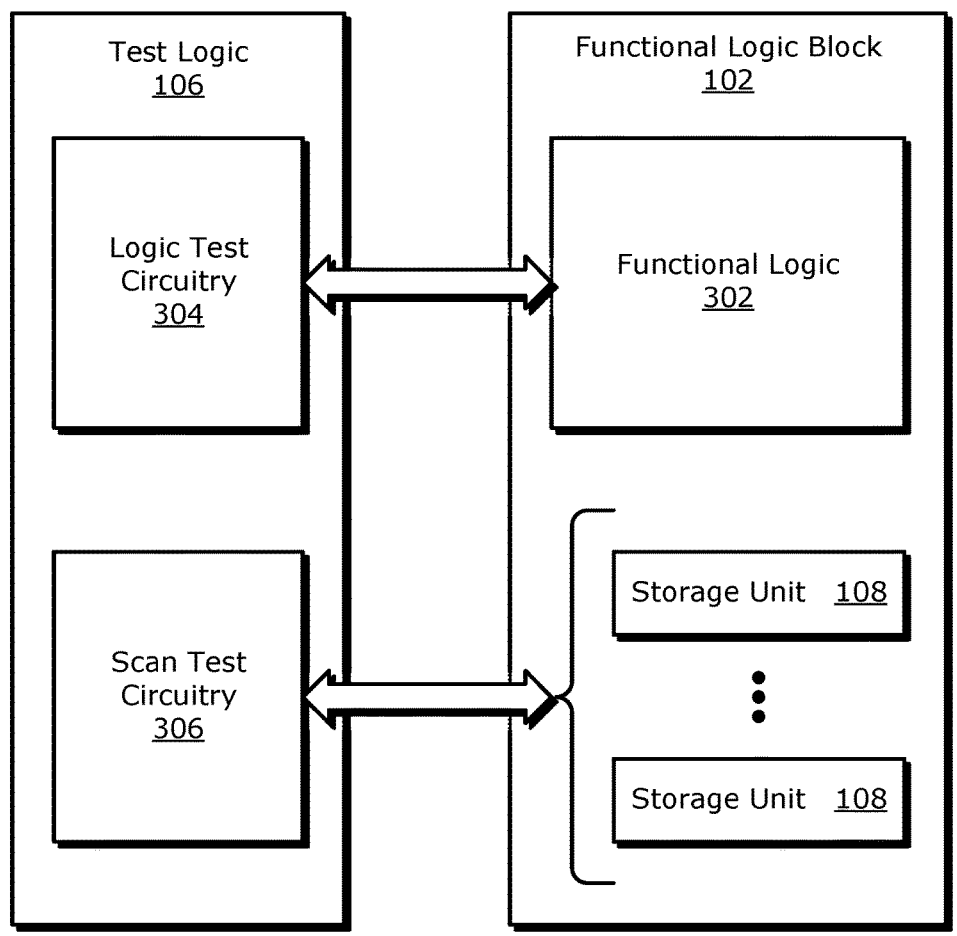
FIG. 3 illustrates an example of test logic having logic test circuitry and scan test circuitry to perform tests on the functional logic block.

FIG. 3 illustrates an example of the first phase 206-1 of the testing mode 202 (of FIG. 2) with the test logic 106 having logic test circuitry 304 and scan test circuitry 306 to perform tests on the functional logic block 102. As shown, the functional logic block 102 includes functional logic 302 along with the multiple storage units 108. The functional logic 302 implements the processing functionality associated with the functional logic block 102. The logic test circuitry 304 performs a logic test to determine if the functional logic 302 has been designed and fabricated correctly such that the functional logic 302 can operate within prescribed specifications.

The scan test circuitry 306 performs a scan test to determine if the storage units 108, including constituent parts thereof, have been designed and fabricated correctly such that the storage units 108 can operate within prescribed specifications. For example, if the storage units 108 are formed from multiple flip-flops (not shown in FIG. 3), the scan test circuitry 306 tests the storage units 108 to determine if each flip-flop is capable of reliably storing one bit of data. To do so, the scan test circuitry 306 actuates the multiple flip-flops into a scan chain having one or more individual or separately accessible registers. A scan test pattern is entered into each register and then read out to verify that the flip-flops are properly saving and returning stored data.

Figure 4:
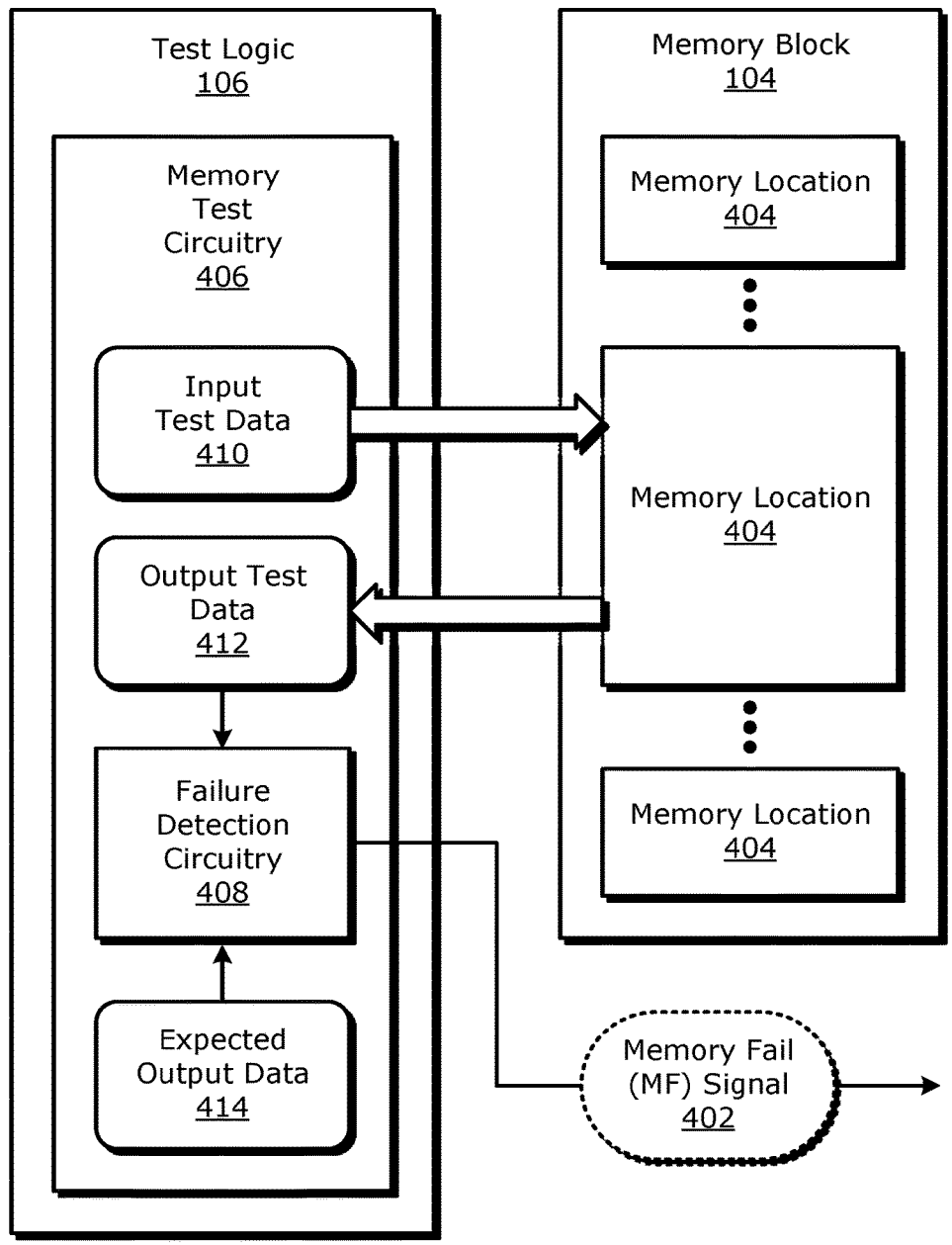
FIG. 4 illustrates an example of test logic having memory test circuitry to perform a test on the memory block.

FIG. 4 illustrates an example of the second phase 206-2 of the testing mode 202 (of FIG. 2) with the test logic 106 having memory test circuitry 406 to perform a memory test on the memory block 104. The memory block 104 includes multiple memory locations 404, and the memory test circuitry 406 includes failure detection circuitry 408. The memory test circuitry 406 further includes or otherwise has access to input test data 410, output test data 412, and expected output data 414. As described below, the failure detection circuitry 408 produces a memory fail signal 402 (MF signal) based on the output test data 412 and the expected output data 414.

In example implementations, the memory test circuitry 406 performs a test of the memory block 104 on a per-memory-location basis. Each memory location 404 can be implemented as, for example, a storage bit, a word with multiple bits, an addressable memory range, a row, a column, a page, or a combination thereof. To perform a memory test, the memory test circuitry 406 applies a series of memory access operations to a memory location 404 using a test pattern. A series of memory access operations, or memory task, can include, for instance, write-write-read, read-write-read-write-read, and write-read-read. Each memory access operation or series thereof corresponds to a phase of the memory test. Each phase of a memory testing algorithm, individually or jointly, is intended to verify that the memory location 404 can perform reliably regardless of the stresses applied to the transistors or other circuit devices used to realize the memory location 404.

Thus, to perform a test on the memory block 104, the memory test circuitry 406 generates one or more test patterns. A test pattern is an example of the input test data 410. The memory test circuitry 406 provides the input test data 410 to a memory location 404. For example, the memory test circuitry 406 can write or store the input test data 410 to the memory location 404. The memory test circuitry 406 then obtains the output test data 412 from the current contents of the memory location 404, which is responsive to the provided input test data 410. For example, the memory test circuitry 406 can read or retrieve the output test data 412 from the memory location 404.

The failure detection circuitry 408 receives the output test data 412 and the expected output data 414. Typically, the expected output data 414 is set the same as the input test data 410. The failure detection circuitry 408 compares the output test data 412 to the expected output data 414. The failure detection circuitry 408 determines if a difference exists between the output test data 412 and the expected output data 414. If a difference is detected, then the failure detection circuitry 408 outputs the memory fail signal 402 or drives the memory fail signal 402 active. The memory fail signal 402 triggers the retaining of data characterizing the memory location failure, which is described with reference to FIG. 5. If, on the other hand, no failure is detected, then performance of the memory test continues by applying another memory accessing operation to the current memory location 404 or by applying memory access operations to another (e.g., the next) memory location 404 of the memory block 104.

Generally, a memory operation task can include a sequence of memory accesses on a current memory location 404. Such memory accesses can include providing the input test data 410 to the memory location 404, obtaining the output test data 412 from the memory location 404, some combination thereof, and so forth. Examples of memory accessing operations include a write-read-read or a write-write-read sequence of memory accesses. These sequencings of memory accessing operations, or a current memory operation task, are also referred to as phase information for the memory test. Because a given memory location 404 may pass one memory operation task but fail another one, the particular memory operation task that results in a detected memory location failure can be relevant to diagnosing a design or fabrication defect of the memory block 104 of the integrated circuit 100 or of an overall wafer. Accordingly, an indication of the memory operation that precipitates a memory location failure is also retained in an example implementation as described in FIG. 5.

Figure 5:
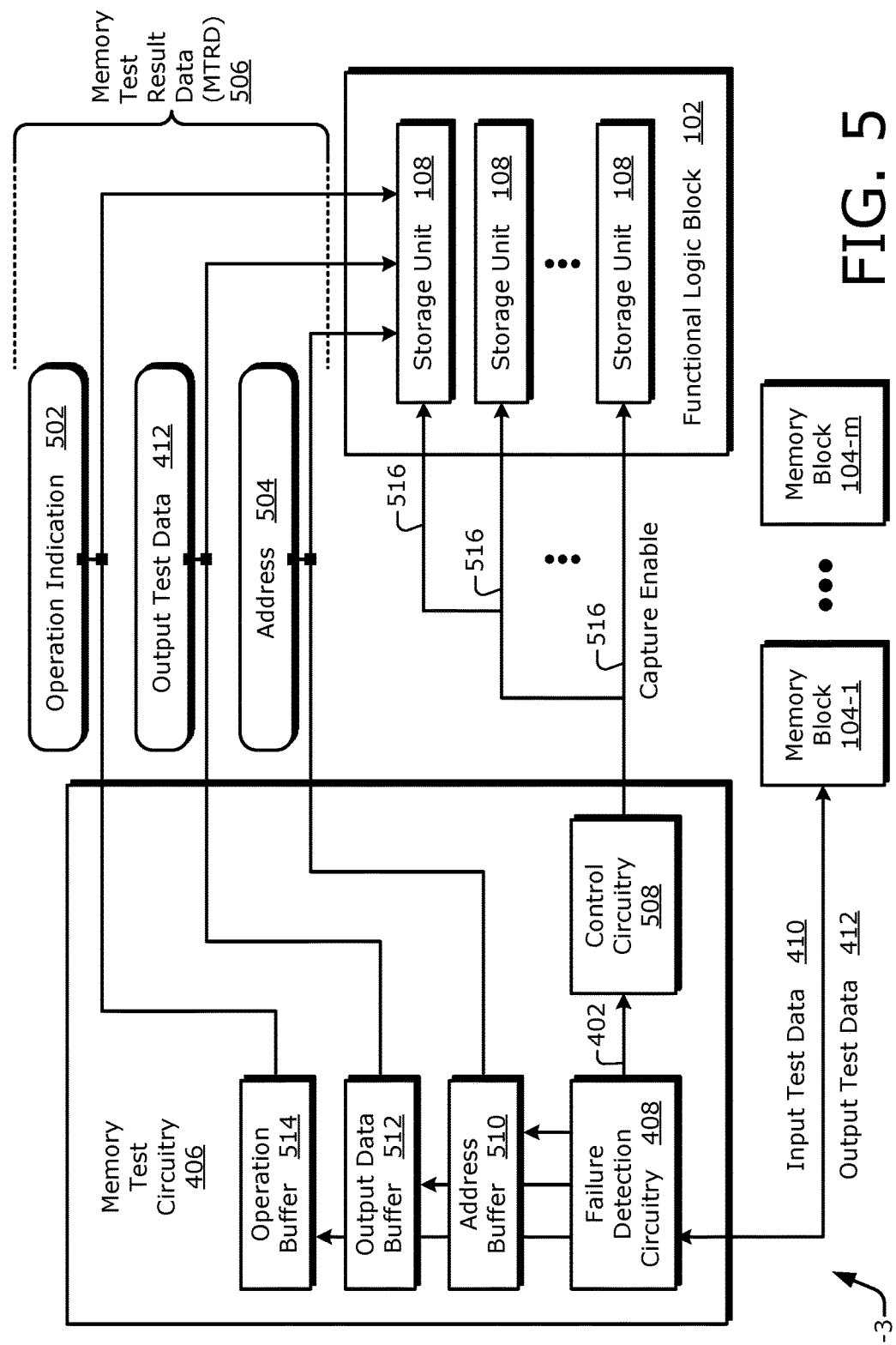
FIG. 5 illustrates an example scheme for testing a memory block by borrowing storage units of a functional logic block during a testing mode.

FIG. 5 illustrates an example of the third phase 206-3 of the testing mode 202 (of FIG. 2) that includes an example storage scheme implemented during the testing of a memory block 104. The example storage scheme entails borrowing storage units 108 of the functional logic block 102 to retain memory test result data 506 (MTRD) produced during the testing of the memory block 104. The memory test result data 506 includes information that characterizes a memory location failure. As shown, the memory test result data 506 includes output test data 412, an address 504, and an operation indication 502. The memory test circuitry 406 includes, in addition to the failure detection circuitry 408, an address buffer 510, an output data buffer 512, an operation buffer 514, and control circuitry 508.

The example storage scheme of FIG. 5 is capable of retaining memory test result data 506 for one memory block 104 or for multiple memory blocks 104. In FIG. 5, "m" memory blocks 104-1 to 104-m are shown, with "m" representing some integer. The multiple memory blocks 104-1 to 104-m can be tested sequentially or in parallel using memory block groups. For example, the "m" memory blocks can be divided into three memory block groups. After the memory blocks 104 of each memory block group are tested concurrently, the memory test result data 506 that is retained for a given group is extracted from the multiple storage units 108 and made available external to the integrated circuit. Examples of memory block grouping and testing order is described with reference to FIG. 10.

In operation, as described above with reference to FIG. 4, the memory test circuitry 406 performs a test on the memory block 104 (e.g., the memory block 104-1). Based on the input test data 410 and the output test data 412, the failure detection circuitry 408 detects a failure of a memory location 404 and generates the memory fail signal 402. The failure detection circuitry 408 supplies the memory fail signal 402 to the control circuitry 508. The failure detection circuitry 408 also stores the address 504 in the address buffer 510, the output test data 412 in the output data buffer 512, and the operation indication 502 in the operation buffer 514.

The output test data 412 includes the data retrieved from a memory location 404 of the memory block 104 that failed to match the expected output data 414 (of FIG. 4). The address 504 includes the address of the failed memory location 404. The operation indication 502 includes an indicator of (e.g., an alphanumeric value or code representative of) a memory task that produced the failed memory location 404, such as a value indicative of a sequence of memory accessing operations or phase of a memory test.

The address 504, the output test data 412, or the operation indication 502 jointly represent the memory test result data 506 for the corresponding failed memory location 404. Memory test result data 506 is also referred to as a memory fail signature.

Responsive to the memory fail signal 402, the control circuitry 508 prepares to retain memory test result data 506 by activating a next-available storage unit 108 of the functional logic block 102 for storage of the memory test result data 506 that is present at the three buffers of the memory test circuitry 406. To accomplish this control and decoding functionality, the control circuitry 508 generates a capture enable signal 516 and provides the capture enable signal 516 (e.g., a clocking signal) to the storage unit 108 (e.g., to the flip-flops thereof). Additionally or alternatively, the control circuitry 508 generates at least one signal to select a particular input data for forwarding to an output at each of one or more multiplexers that are associated with the enabled storage unit 108. Example implementations of a storage unit 108 including a register having multiple flip-flops as well as associated multiplexers are described with reference to FIGS. 6-9. Example implementations of the control circuitry 508 are described with reference to FIGS. 6 and 8.

Figure 6:
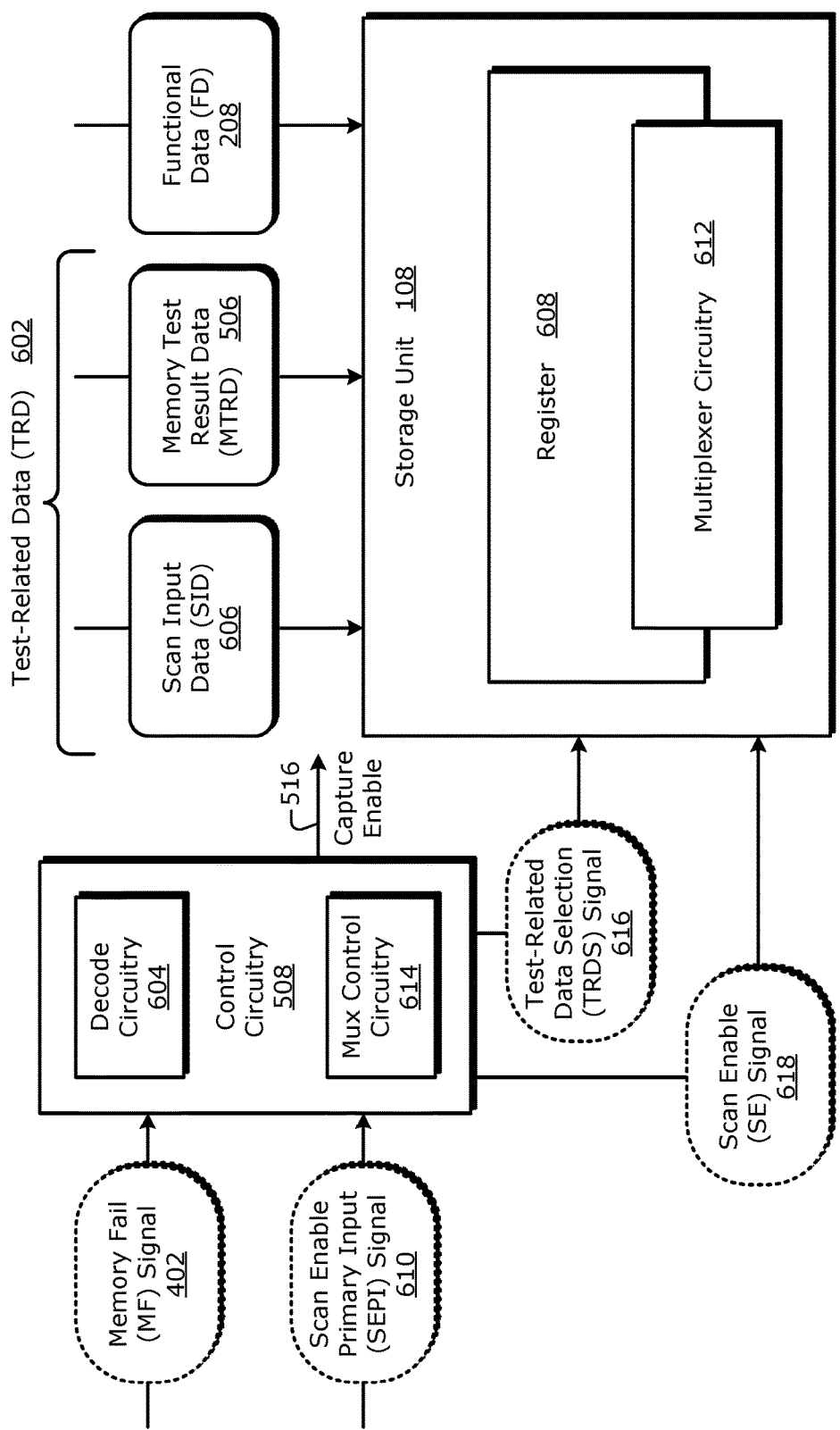
FIG. 6 illustrates an example mechanism for control circuitry to operate a storage unit that is being repurposed to retain memory test result data during the testing mode.

FIG. 6 illustrates an example mechanism 600 for the control circuitry 508 to operate a storage unit 108 that is being repurposed to retain memory test result data 506 during a testing mode 202 (of FIG. 2). As shown, the control circuitry 508 includes decode circuitry 604 and multiplexer control circuitry 614 (mux control circuitry). The control circuitry 508 receives one or more incoming signals and generates one or more outgoing signals to control operation of the storage unit 108. The storage unit 108 includes at least one register 608 and associated multiplexer circuitry 612. Example implementations for a storage unit 108 with a register 608 and multiplexer circuitry 612 are described below with reference to FIGS. 7 and 9.

The storage unit 108 receives different data at different times and in different modes, e.g., in the testing mode 202 or the regular operational mode 204. The incoming data includes functional data 208 (FD) or test-related data 602 (TRD). The functional data 208, which is described above with reference to FIG. 2, is stored in the storage unit 108 by the functional logic block 102 during the regular operational mode 204. The test-related data 602 includes memory test result data 506 (MTRD) or scan input data 606 (SID). The memory test result data 506 is described above with reference to FIG. 5 in the context of borrowing the storage unit 108 for a memory test to verify the reliability of a memory block 104. For the scan input data 606, the scan test circuitry 306 of FIG. 3 applies the scan input data 606 to the storage unit 108 to verify the reliability of the storage unit 108. To perform the scan test, the storage unit 108 is actuated into a scan chain for the first phase 206-1 of the testing mode 202 by activating the register 608 as a shift register.

Four signals are depicted in FIG. 6. These six signals include: the memory fail signal 402 (MF), a scan enable primary input signal 610 (SEPI), a test-related data selection signal 616 (TRDS), and a scan enable signal 618 (SE). The control circuitry 508 receives the memory fail signal 402 and the scan enable primary input signal 610 as input signals. The control circuitry 508 generates the test-related data selection signal 616 and the scan enable signal 618 and provides these as output signals. More specifically, the multiplexer control circuitry 614 controls operation of the storage unit 108 by processing the incoming signals and by generating a data selection signal based on a state of the memory fail signal 402. An example implementation of the multiplexer control circuitry 614 is described with reference to FIG. 8 to explain how the test-related data selection signal 616 and the scan enable signal 618 can be generated and applied to a storage unit 108.

In example implementations, the memory fail signal 402 is provided by the failure detection circuitry 408 as shown in FIGS. 4 and 5. The scan enable primary input signal 610 is a scan enable signal that is received external from the chip to control actuation of one or more scan chains within the integrated circuit. The scan enable signal 618 selects between the test-related data 602 and the functional data 208. The test-related data selection signal 616 selects between the memory test result data 506 and the scan input data 606. These signal selections are realized using the multiplexer circuitry 612 of the storage unit 108. Application of the selection signals is described below with reference to FIGS. 7-9.

In operation, the decode circuitry 604 keeps track of which storage unit 108 is next to be activated to retain memory test result data 506. The decode circuitry 604 enables the register 608 of the storage unit 108 using the capture enable signal 516. In conjunction with appropriate decoding to activate the correct next storage unit 108, the capture enable signal 516 can be realized as a clocking signal (not shown in FIG. 6) that is applied to flip-flops forming the register 608. Example implementations for a storage unit 108 at the flip-flop and multiplexer level are described with reference to FIGS. 7 and 9.

Figure 7:
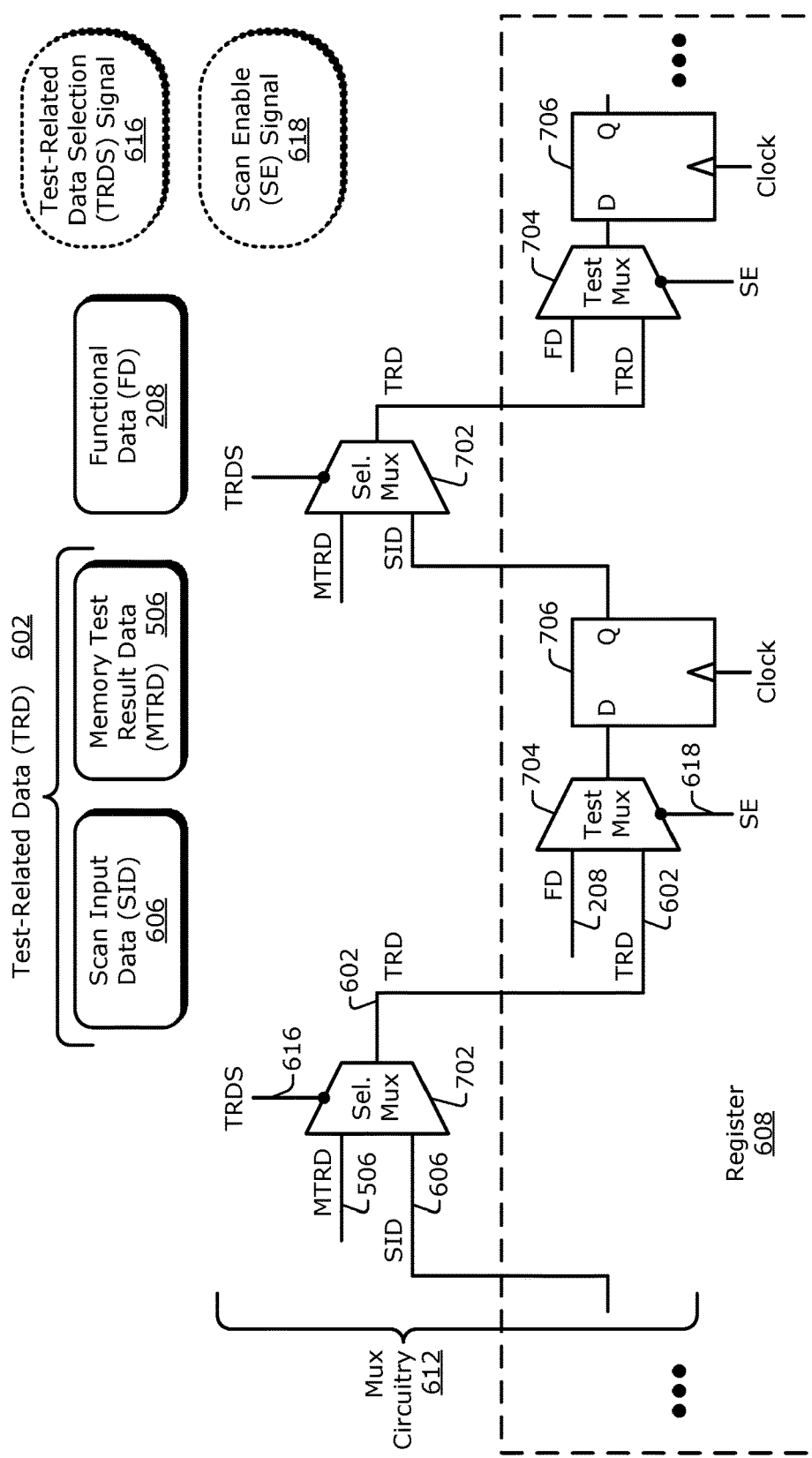
FIG. 7 illustrates an example storage unit including a register in conjunction with multiplexer circuitry.

FIG. 7 illustrates an example storage unit 108 including a register 608 in conjunction with multiplexer circuitry 612. Each register 608 includes multiple flip-flops 706. The flip-flops 706 are illustrated as "d" flip-flops, but the flip-flops 706 may be implemented using one or more other types of flip-flops or with additional flip-flop features, such as setting or resetting. Each flip-flop 706 has at least an input node ("D"), an output node ("Q"), and a clocking input node ("clock"). The multiplexer circuitry 612 includes multiple multiplexers. These multiplexers include selection multiplexers 702 (sel. mux) and test multiplexers 704 (test mux). Each respective flip-flop 706 is associated with two multiplexers: a selection multiplexer 702 and a test multiplexer 704. Alternatively, each selection multiplexer 702 and test multiplexer 704 can be realized as a single multiplexer (e.g., a multiplexer having three inputs and one output).

Generally, for the storage unit 108 implementation as shown in FIG. 7, the selection multiplexers 702 multiplex between instances of test-related data 602 (TRD), and the test multiplexers 704 multiplex between functional data 208 and test-related data 602. Either or both of the selection multiplexers 702 and the test multiplexers 704 of the storage unit 108 can be incorporated as part of the register 608. As illustrated, however, the selection multiplexers 702 are external to the register 608, and the test multiplexers 704 are internal to the register 608. This depiction reflects that one set of multiplexers, such as the test multiplexers 704, may be included to enable scan testing of the flip-flops 706, even without implementing storage borrowing for embedded memory testing as described herein. From this perspective, the selection multiplexers 702 are "added" to the register 608 to enable the described storage borrowing for embedded memory testing. Thus, implementations for embedded memory testing with storage borrowing can be realized by adding one multiplexer per bit of memory test result data 506 being retained during performance of the memory testing algorithm. However, approximately one-fourth of the circuit devices (e.g., the transistors) used to implement the selection multiplexers 702 can be effectively leveraged from other existing circuitry during synthesis of the overall logical circuit design.

As illustrated, each bit of memory test result data 506 is retained using a selection multiplexer 702, a test multiplexer 704, and a flip-flop 706, along with associated control signaling. During the testing mode 202, the flip-flops 706 are actuated into a configuration as the register 608, which can include coupling the flip-flops 706 in series to create a shift register. Thus, this triplet set of a selection multiplexer 702, a test multiplexer 704, and a flip-flop 706 are repeated in a chain of bit-level storage units to retain the memory test result data 506 as is indicated in FIG. 7 by the ellipses on the left and right sides of the register 608.

Starting from the left and moving rightward, the selection multiplexer 702 includes two inputs and one output. A first input is coupled to the memory test circuitry 406 (e.g., of FIG. 5) and receives the memory test result data 506 from the memory test circuitry 406. A second input of the selection multiplexer 702 receives the scan input data 606. The selection multiplexer 702 outputs the test-related data 602 based on the test-related data selection signal 616. If the test-related data selection signal 616 is active, the memory test result data 506 is forwarded as the test-related data 602 at the output of the selection multiplexer 702. If not, the selection multiplexer 702 forwards the scan input data 606 as the test-related data 602.

The test multiplexer 704 includes two inputs and one output. A first input receives the functional data 208 during the regular operational mode 204. A second input of the of the test multiplexer 704 is coupled to the output of the selection multiplexer 702. Thus, the second input receives the test-related data 602. The test multiplexer 704 outputs data at the "D" input node of the flip-flop 706 based on the scan enable signal 618. If the scan enable signal 618 is active, the test-related data 602 is forwarded to the input of the flip-flop 706. If, on the other hand, the scan enable signal 618 is not active, the test multiplexer 704 forwards the functional data 208 to the input of the flip-flop 706 for the regular operational mode.

The data provided to the "D" input node of the flip-flop 706 is advanced to the "Q" output node of the flip-flop 706 responsive to a clock pulse at the clocking input thereof. In other words, data is advanced through the flip-flop 706 responsive to a rising edge or a falling edge of a clocking signal provided by the decode circuitry 604 of the control circuitry 508 (e.g., of FIG. 6). As shown, the "Q" output node of the flip-flop 706 is coupled to the second input of a succeeding selection multiplexer 702 as the "scan input data" (SID). This is effective for the testing mode 202 to scan out data. This coupling is also effective to scan in data for a scan test as performed by the scan test circuitry 306 of FIG. 3. In a regular operational mode 204, the "Q" output node of the flip-flop 706 represents the functional data 208 and can therefore be coupled to other circuitry to support processing functionality provided by a functional logic block 102.

The test-related data 602, such as the memory test result data 506, is output from the register 608 at the conclusion of a memory testing algorithm on a memory block 104 or group of memory blocks 104. Each bit of data from each "Q" output node of the corresponding flip-flop 706 can be output from the integrated circuit 100 by shifting out the data bits from the chained arrangement of flip-flops along the register 608 in a manner that is analogous to that for a scan test. Alternatively, each bit of data from each "Q" output node of the corresponding flip-flop 706 can be output from the integrated circuit 100 by using circuitry (not explicitly shown) that is otherwise employed by the functional logic block 102 to output the functional data 208 during regular operational modes.

Figure 8:
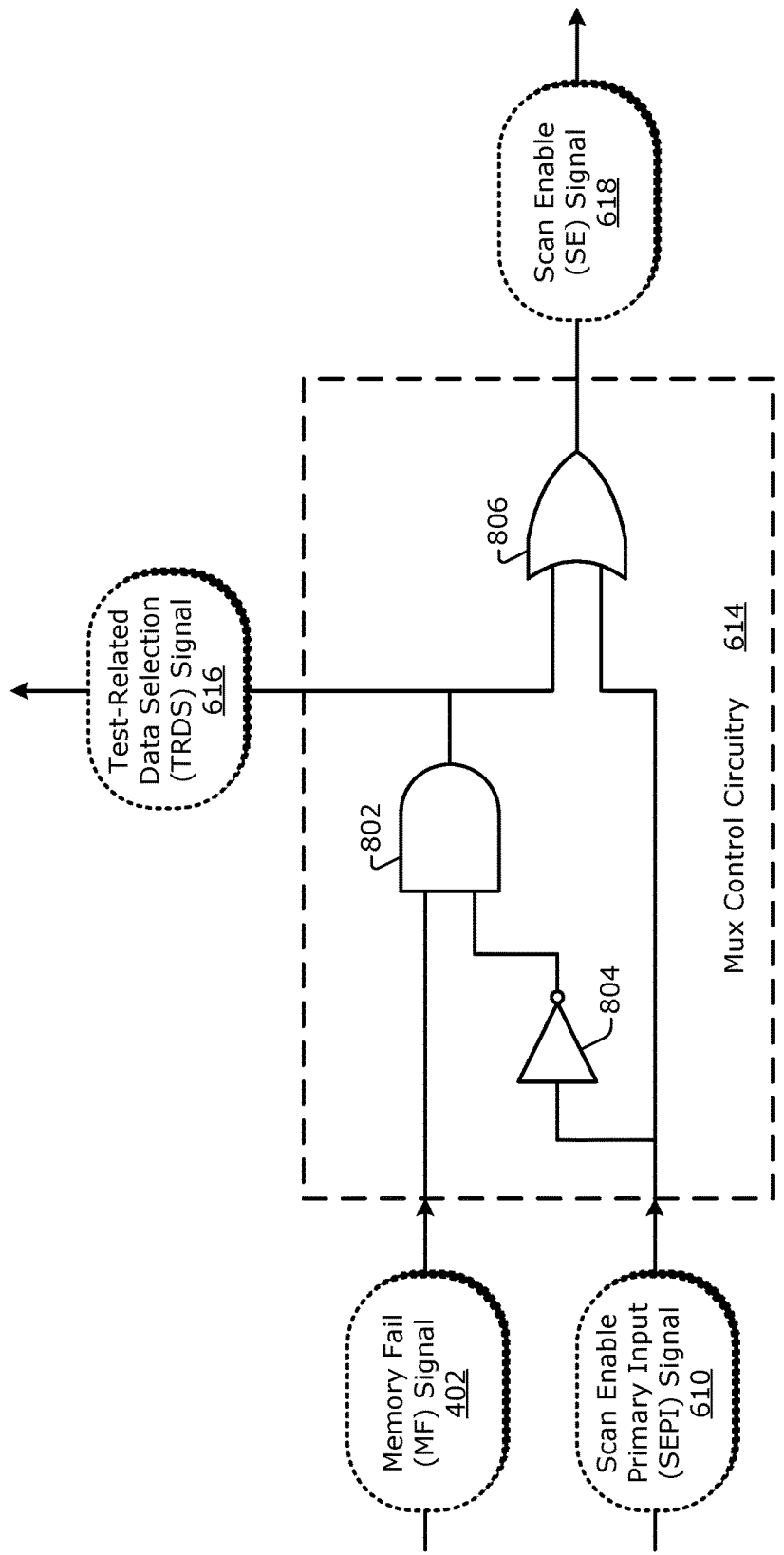
FIG. 8 illustrates an example implementation for multiplexer control circuitry to operate the storage unit during the testing mode.

FIG. 8 illustrates an example implementation for multiplexer control circuitry 614 to operate a storage unit 108 during the testing mode 202. The multiplexer control circuitry 614 controls operation of the multiplexer circuitry 612 of FIGS. 6 and 7. For example, the multiplexer control circuitry 614 can generate multiplexer selection signals to control operation of the selection multiplexers 702 or the test multiplexers 704. Such multiplexer control signals can include the test-related data selection signal 616 and the scan enable signal 618.

Thus, the multiplexer control circuitry 614 controls which data is multiplexed to the flip-flops 706. The multiplexer control circuitry 614 includes multiple circuit devices. As shown, these circuit devices include an AND gate 802, an inverter 804, and an OR gate 806. The AND gate 802 includes a first input, a second input, and an output. The inverter 804 includes an input and an output. The OR gate 806 includes a first input, a second input, and an output. The output of the inverter 804 is coupled to the second input of the AND gate 802. The output of the AND gate 802 is coupled to the first input of the OR gate 806.

The memory fail signal 402 and the scan enable primary input signal 610 are provided to the multiplexer control circuitry 614. Based on these input signals, the multiplexer control circuitry 614 generates and outputs the test-related data selection signal 616 and the scan enable signal 618. The first input of the AND gate 802 receives the memory fail signal 402. The input of the inverter 804 receives the scan enable primary input signal 610. The inverted value of the scan enable primary input signal 610 is therefore provided to the second input of the AND gate 802. The value of the output of the AND gate 802 serves as the test-related data selection signal 616. Thus, the first input of the OR gate 806 receives the test-related data selection signal 616. The second input of the OR gate 806 receives the scan enable primary input signal 610. The value of the output of the OR gate 806 serves as the scan enable signal 618.

A logic table for the operation of the multiplexer control circuitry 614 is provided below in Table 1.

TABLE 1

Logic table for controlling the multiplexer circuitry 612 by the multiplexer control circuitry 614 based on a state of one or more signals.

| MF Signal 402 | SEPI Signal 610 | Function | SE Signal 618 |
|---|---|---|---|
| x | 1 | Scan Test Shifting | 1 |
| 0 | 0 | Functional Logic | 0 |
| 1 | 0 | Memory Test Result Data Retention | 1 |

The multiplexer control circuitry 614 controls operation of the multiplexer circuitry 612 by generating at least one data selection signal based on a state of at least one other signal, such as the memory fail signal 402 or the scan enable primary input signal 610. Examples of a data selection signal include the test-related data selection signal 616 of FIGS. 6-8, a memory-test-result or functional data selection signal 904 (MoFS) of FIG. 9, and the scan enable signal 618 of FIGS. 6-9. A state of a signal can be a logical high (e.g., "1") or a logical low (e.g., "0"), which can correspond to a high voltage or a low voltage, or vice versa.

As indicated by Table 1, if the scan enable primary input signal 610 is active high, the second input to the OR gate 806 is a "1," so the OR gate 806 drives a "1" as the scan enable signal 618. As shown in FIG. 7, the scan enable signal 618 controls the multiplexed output of the test multiplexer 704. Thus, with the scan enable signal 618 being active high, the test multiplexer 704 selects the test-related data 602 for forwarding to the flip-flop 706. This places the register 608 in a shifting mode for scan shift testing in accordance with accepted design for testing (DFT) principles. Additionally, with the scan enable primary input signal 610 being active high, the inverter 804 couples a "0" to the second input of the AND gate 802. Thus, the test-related data selection signal 616 is inactive low, and the selection multiplexer 702 therefore selects the scan input data 606 for forwarding as the test-related data 602 to enable the scan testing.

If, on the other hand, the scan enable primary input signal 610 is inactive low, the memory fail signal 402 can control the output of the scan enable signal 618 and the test-related data selection signal 616. If the memory fail signal 402 is inactive low, then the functional data 208 is provided to the flip-flop 706 because the scan enable signal 618 has a value of "0" as per the "0" output of the AND gate 802. If, however, the memory fail signal 402 is active high, the scan enable signal 618 is also active high because the first input of the OR gate 806 is a "1" as per the "1" output of the AND gate 802. Thus, with the scan enable signal 618 being active high, the test multiplexer 704 selects the test-related data 602 for forwarding to the flip-flop 706. Furthermore, the test-related data selection signal 616 is also active high with a value of "1" at the output of the AND gate 802. As shown in FIG. 7, the test-related data selection signal 616 controls the multiplexed output of the selection multiplexer 702. Thus, if the test-related data selection signal 616 is active high, the selection multiplexer 702 forwards the memory test result data 506 as the test-related data 602 to enable retention of the memory test result data 506 during performance of a memory testing algorithm on a memory block 104.

Figure 9:
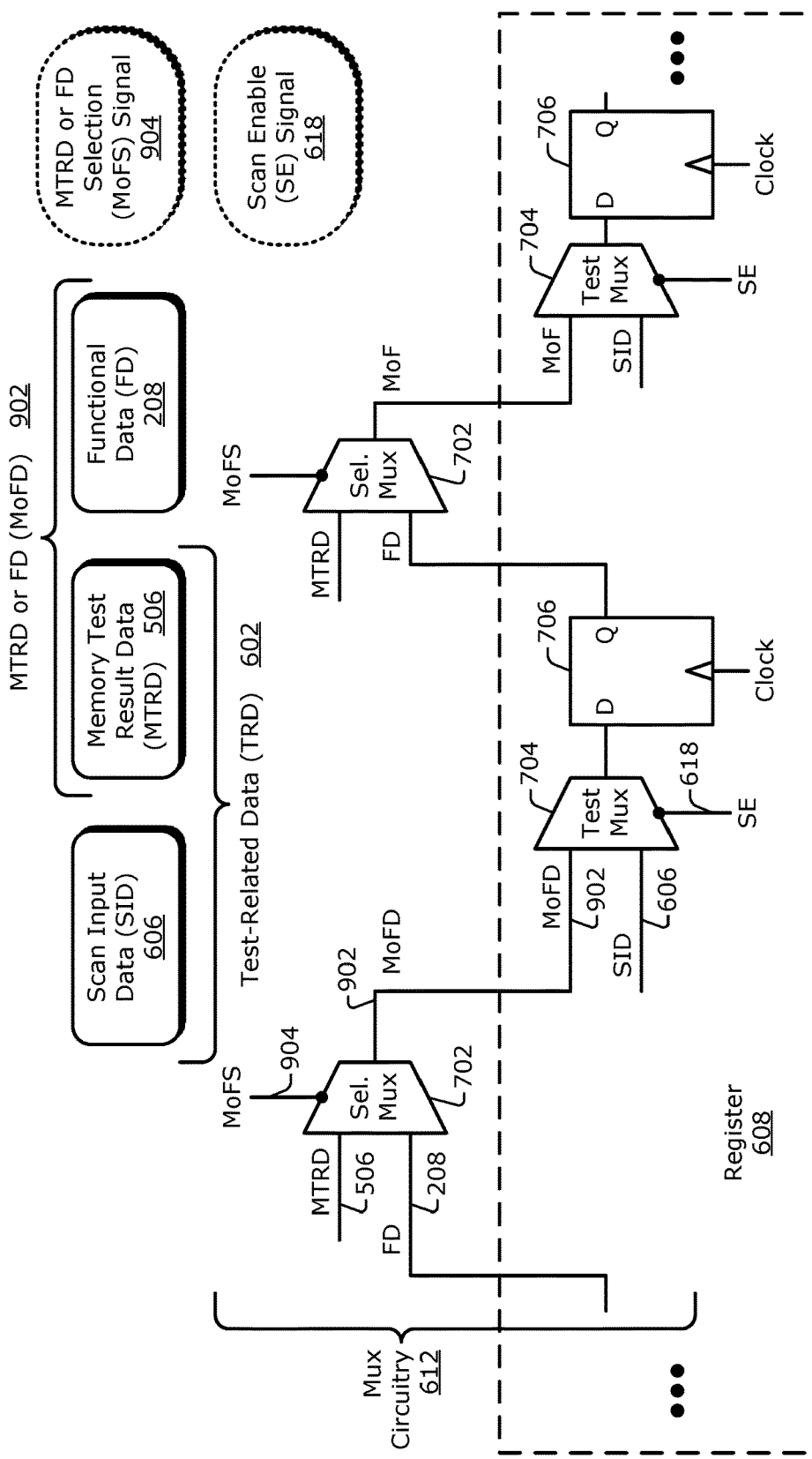
FIG. 9 illustrates another example storage unit including a register in conjunction with multiplexer circuitry.

FIG. 9 illustrates another example storage unit 108 including a register 608 in conjunction with multiplexer circuitry 612. The storage unit 108 of FIG. 9 is similar to the storage unit 108 of FIG. 7. However, the inputs and outputs of the individual multiplexers are different. At least one of the multiplexer selection control signals is also different to accommodate the different input data. Generally, the scan input data 606 is coupled closer to the "D" input node of the flip-flop 706 at the test multiplexer 704, and the functional data 208 is coupled farther from the "D" input node of the flip-flop 706 at the selection multiplexer 702.

More specifically, the implementation of FIG. 9 involves the following data inputs: the scan input data 606, the memory test result data 506, and the functional data 208. The scan input data 606 and the memory test result data 506 are examples of test-related data 602. The memory test result data 506 and the functional data 208 are examples of memory-test-result or functional data 902 (MoFD). FIG. 9 further involves a memory-test-result or functional data selection signal 904 (MoFS) and the scan enable signal 618.

Starting from the left and moving rightward, the selection multiplexer 702 includes two inputs and one output. A first input is coupled to the memory test circuitry 406 (e.g., of FIG. 5) and receives the memory test result data 506 from the memory test circuitry 406. A second input of the selection multiplexer 702 receives the functional data 208 during a regular operational mode 204. The selection multiplexer 702 outputs the memory-test-result or functional data 902 based on the memory-test-result or functional data selection signal 904. If the memory-test-result or functional data selection signal 904 is active, the selection multiplexer 702 forwards the memory test result data 506 as the memory-test-result or functional data 902 at the output of the selection multiplexer 702.

The test multiplexer 704 includes two inputs and one output. A first input of the of the test multiplexer 704 is coupled to the output of the selection multiplexer 702. Thus, the first input receives the memory-test-result or functional data 902. The second input receives the scan input data 606 during a scan test portion of the testing mode 202. The test multiplexer 704 outputs data for the "D" input node of the flip-flop 706 based on the scan enable signal 618. If the scan enable signal 618 is active, the test multiplexer 704 forwards the scan input data 606 to the input of the flip-flop 706 for the scan test portion of the testing mode 202. If, on the other hand, the scan enable signal 618 is inactive, the memory-test-result or functional data 902 is forwarded to the input of the flip-flop 706 (e.g., which is the memory test result data 506 or the functional data 208, depending on the memory-test-result or functional data selection signal 904 that controls the selection multiplexer 702).

The multiplexer control circuitry 614 as described above with reference to FIG. 8 can be modified to accommodate the example implementation of FIG. 9. Such modifications can ensure that the multiplexer circuitry 612 ultimately couples the appropriate data—the functional data 208, the memory test result data 506, or the scan input data 606—to the "D" input node of the flip-flop 706 at the appropriate time for a given operational mode. For example, the functional data 208 is to be coupled to the input of the flip-flop 706 during the regular operational mode 204. During a scan testing portion of the testing mode 202, the multiplexer circuitry 612 is to couple the scan input data 606 to the input of the flip-flop 706. And during a memory testing portion of the testing mode 202, the multiplexer circuitry 612 is to couple the memory test result data 506 to the input of the flip-flop 706.

In FIG. 9, the functional data 208 is multiplexed with the memory test result data 506 at the selection multiplexers 702. In comparison with an integrated circuit that lacks the storage borrowing for embedded memory testing as described herein but includes scan testing capabilities, the example implementation of the storage unit 108 as depicted in FIG. 9 has the following potential effect. The functional data 208 is subjected to an additional delay element by the selection multiplexer 702. However, this delay can be accounted for in the operational design of the overall integrated circuit.

Figure 10:
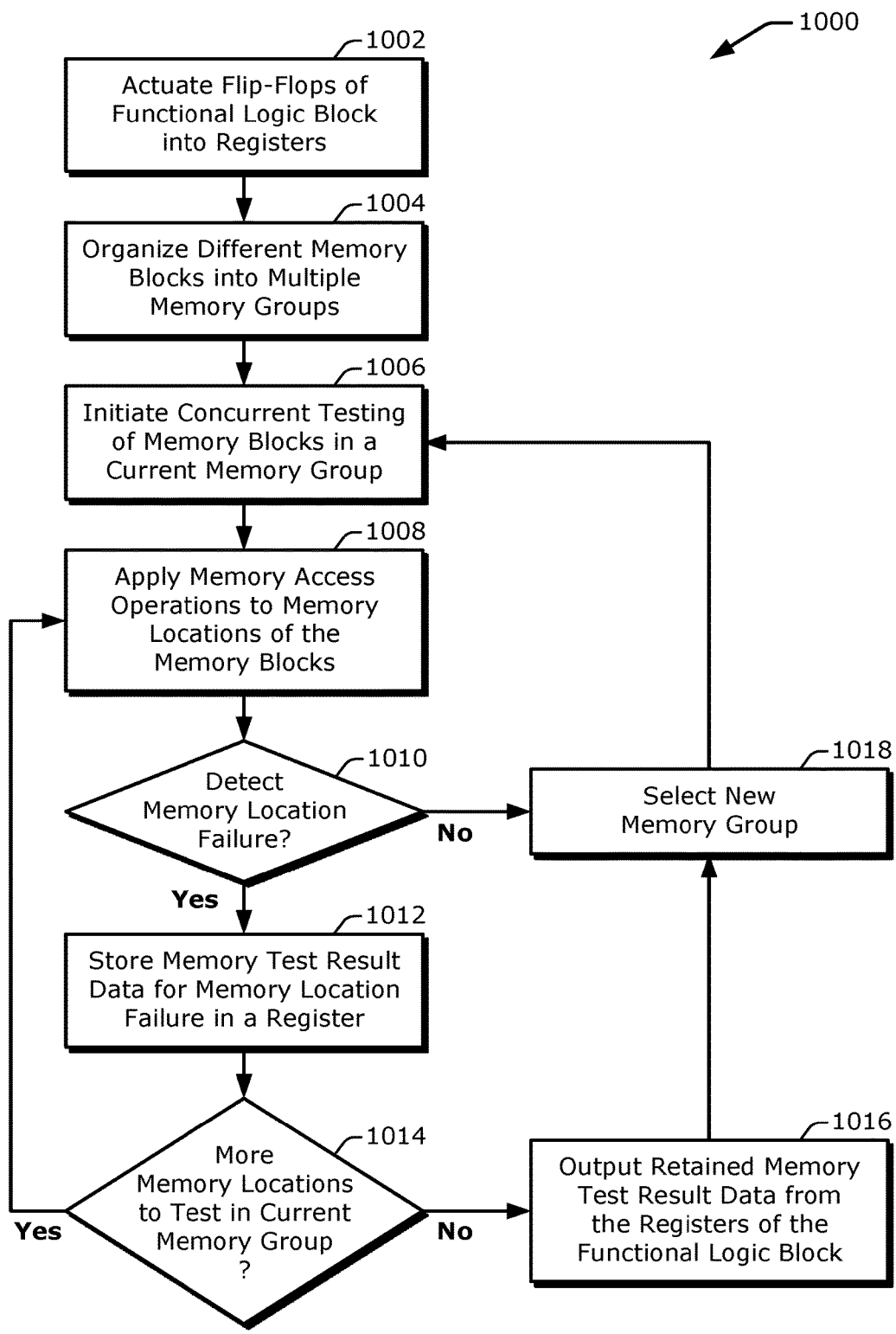
FIG. 10 is a flow diagram illustrating an example process for borrowing storage for embedded memory testing as described herein.
Figure 11:
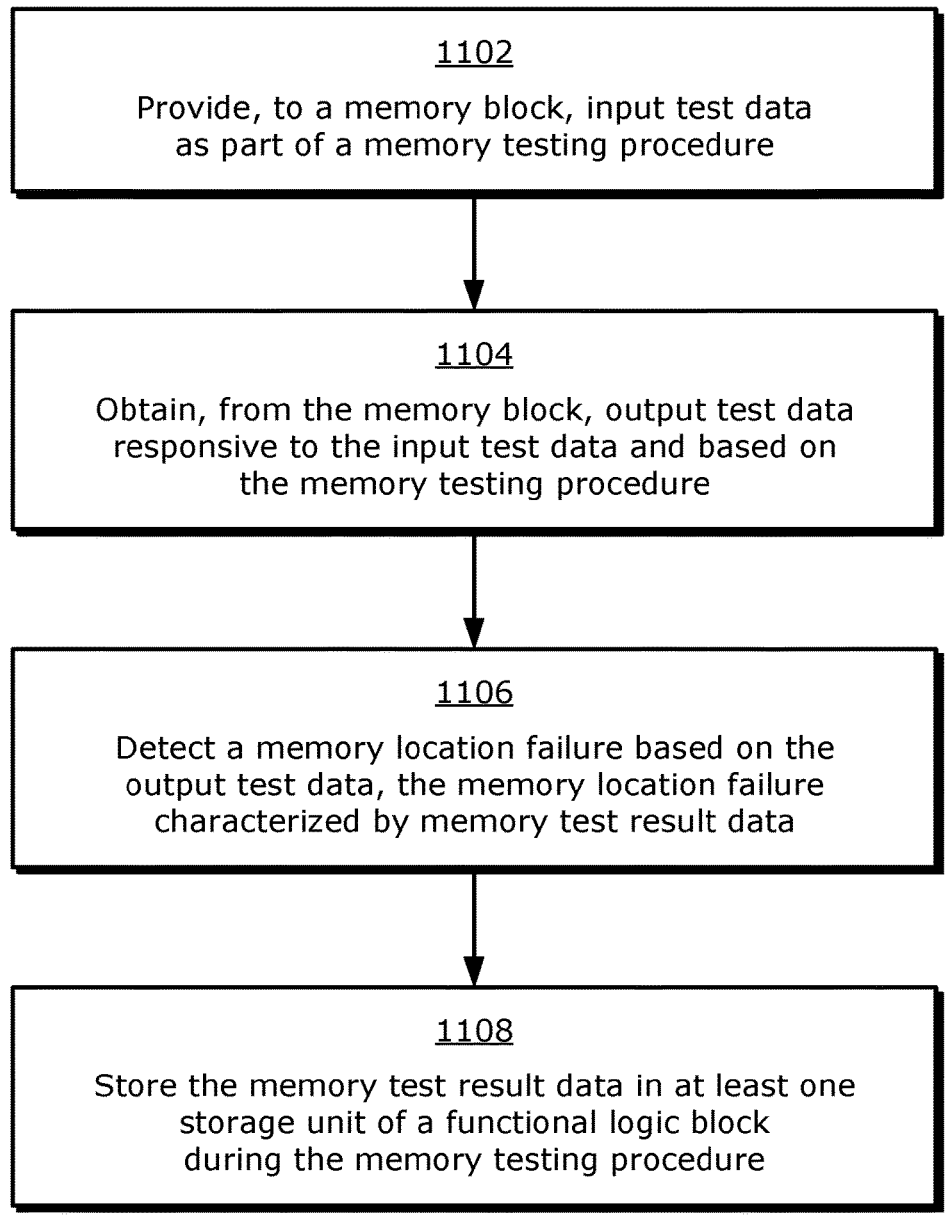
FIG. 11 is another flow diagram illustrating another example process for borrowing storage for embedded memory testing as described herein.

FIGS. 10-11 depict flow diagrams directed to various aspects of embedded memory testing with storage borrowing. These flow diagrams are illustrated in the drawings and described herein using multiple blocks that indicate operations that may be performed or states that may be taken by an integrated circuit. However, occurrence of the operations and states are not necessarily limited to the orders illustrated in FIGS. 10-11 or as described herein, for the operations and states may be implemented in alternative orders or in fully or partially overlapping manners.

FIG. 10 illustrates an example flow diagram 1000 for borrowing storage for embedded memory testing as described herein. The flow diagram 1000 includes nine blocks 1002-1018, with each block representative of at least one operation. The operations of the flow diagram 1000 can be performed by, for example, the test logic 106 of FIGS. 1-4, et seq. At block 1002, multiple flip-flops 706 of the functional logic block 102 are actuated into one or more registers 608. The test logic 106 organizes, at block 1004, different ones of the memory blocks 104-1 to 104-$m$ into multiple memory groups, such as four memory block groups A, B, C, and D. At block 1006, concurrent testing of the memory blocks 104 of a current memory group is initiated by the test logic 106. Thus, the memory blocks 104 of the memory block group A can be tested in parallel.

At block 1008, the memory test circuitry 406 of the test logic 106 applies memory access operations to memory locations 404 of the memory blocks 104 of the current memory group. The failure detection circuitry 408 of the memory test circuitry 406 determines if a memory location failure has occurred at block 1010. If no memory location failure is detected in a current memory group, then at block 1018 the memory test circuitry 406 selects a new memory group, such as memory block group B. The process of the flow diagram 1000 then continues at block 1006 by initiating concurrent testing on the memory blocks of the new current memory group.

If, on the other hand, a memory location failure is detected at block 1010, then at block 1012 the memory test circuitry 406 causes memory test result data 506 for the memory location failure to be stored in a register 608 associated with the functional logic block 102 for retention during performance of the memory testing algorithm. If some memory locations 404 are yet to be tested in the current memory group, as checked at block 1014, then the process continues at block 1008 with more memory access operations being applied to a current memory location 404 or with another memory location 404. If, on the other hand, there are no more memory locations to be tested in the current memory group, as checked at block 1014, the process continues at block 1016.

At block 1016, the memory test circuitry 406 causes the retained memory test result data 506 to be output from the registers 608 of the functional logic block 102. The memory test result data 506 can be scanned out in a manner analogous to a scan test or can be read out functionally in a manner analogous to that implemented by processing functionality of a regular operational mode. With a scan out implementation, the memory test circuitry 406 causes the retained memory test result data 506 to be output from the registers 608 in a serial mode (e.g., one bit at a time). With a functional read out implementation, the memory test circuitry 406 causes the retained memory test result data 506 to be output from the registers 608 in a parallel mode (e.g., one word or 32 bits at a time). During a parallel functional read out, the memory test circuitry 406 can independently access each register as an atomic unit using an address that is associated with the register. After the data outputting, the process continues with a new memory group selection at block 1018.

FIG. 11 is a flow diagram illustrating an example process 1100 for borrowing storage for embedded memory testing. The process 1100 is described in terms of a set of four blocks 1102-1108, with each block representative of at least one operation. The operations may be performed by an integrated circuit, such as an integrated circuit 100 of FIG. 1 or an integrated circuit 1210 of FIG. 12, which is described below. More specifically, the operations of the process 1100 may be performed by the test logic 106 of FIGS. 1-4, et seq.

At block 1102, input test data is provided to a memory block as part of a memory testing procedure. For example, the integrated circuit 100 can provide, to a memory block 104, input test data 410 as part of a memory testing procedure. To do so, memory test circuitry 406 may store a test pattern in a memory location 404 of the memory block 104 as part of a memory accessing task or phase of a testing algorithm.

At block 1104, output test data is obtained from the memory block responsive to the input test data and based on the memory testing procedure. For example, the integrated circuit 100 can obtain, from the memory block 104, output test data 412 responsive to the input test data 410 and based on the memory testing procedure. The memory test circuitry 406 may retrieve current contents from the memory location 404 at the conclusion of a memory accessing task that included the storing of the test pattern.

At block 1106, a memory location failure is detected based on the output test data, with the memory location failure characterized by memory test result data. For example, the integrated circuit 100 can detect a memory location failure based on the output test data 412, with the memory location failure characterized by memory test result data 506. For instance, failure detection circuitry 408 may detect a discrepancy between the output test data 412 and expected output data 414, such as the input test data 410. The memory test result data 506 may comprise a memory fail signature that includes an address 504 of the memory location failure, the output test data 412 that is responsive to the input test data 410, and an operation indication 502 for a memory task that resulted in the detection of the memory location failure.

At block 1108, the memory test result data is stored in at least one storage unit of a functional logic block during the memory testing procedure. For example, the integrated circuit 100 can store the memory test result data 506 in at least one storage unit 108 of a functional logic block 102 during the memory testing procedure. During a testing mode 202, the memory test circuitry 406 may enable at least one flip-flop 706, or a register 608 formed from multiple such flip-flops 706, to retain the memory test result data 506 until the memory testing algorithm is completed.

Example implementations for the detecting operation of the block 1106 can include comparing the output test data 412 to expected output data 414 in accordance with the memory testing procedure. Example implementations for the storing operation of the block 1108 can include, with the at least one storage unit 108 comprising a register 608, actuating multiple flip-flops 706 of the functional logic block 102 to form the register 608 and multiplexing the memory test result data 506 into the multiple flip-flops 706.

Example implementations of the process 1100 can further include, after performance of the memory testing procedure is completed, an operation of using the at least one storage unit 108 to store functional data 208 in support of processing functionality implemented by the functional logic block 102.

Some implementations pertain to scenarios in which the at least one storage unit 108 comprises a register 608. Thus, example implementations of the process 1100 can further include, prior to completion of the memory testing procedure, an operation of performing a scan test on the register 608 of the functional logic block 102 by scan test circuitry 306. Also, example implementations of the process 1100 can further include an operation of scanning out, from the register 608 of the functional logic block 102, the memory test result data 506 after the memory testing procedure has been performed on the memory block 104.

Figure 12:
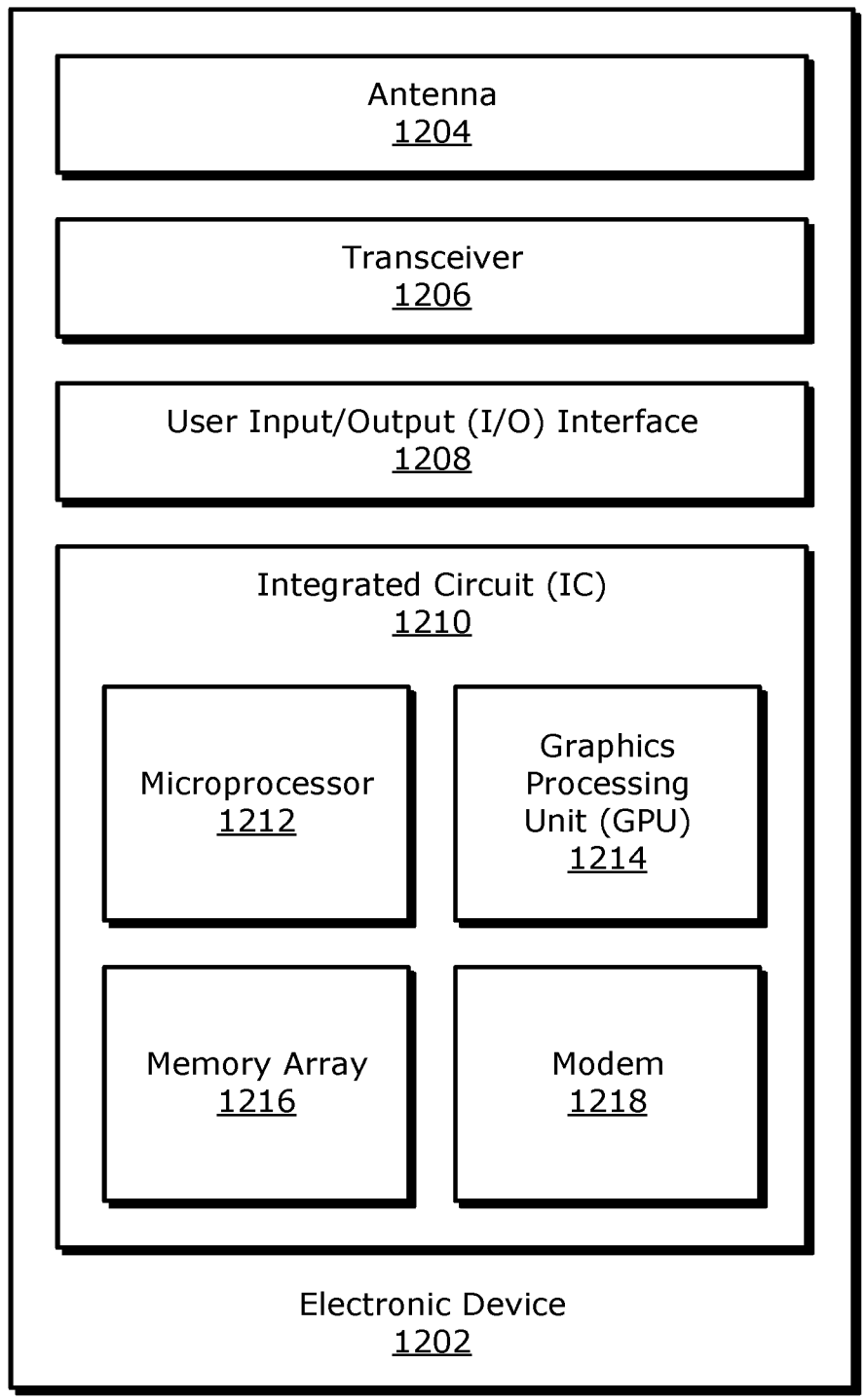
FIG. 12 illustrates an example electronic device that includes an integrated circuit in which storage can be borrowed for embedded memory testing as described herein.

FIG. 12 depicts an example electronic device 1202 that includes an integrated circuit (IC) 1210 in which storage can be borrowed for embedded memory testing as described herein. As shown, the electronic device 1202 includes an antenna 1204, a transceiver 1206, and a user input/output (I/O) interface 1208 in addition to the integrated circuit 1210. Illustrated examples of the integrated circuit 1210, or cores thereof, include a microprocessor 1212, a graphics processing unit (GPU) 1214, a memory array 1216, and a modem 1218. In one or more implementations, the borrowing of storage to facilitate embedded memory testing as described herein can be implemented by the integrated circuit 1210, e.g., by using storage units 108 (e.g., of FIG. 5) of the microprocessor 1212, the GPU 1214, or the modem 1218 to store memory test result data 506 (e.g., of FIG. 5) produced during application of a memory test to the memory array 1216.

The electronic device 1202 can be a mobile or battery-powered device or a fixed device that is designed to be powered by an electrical grid. Examples of the electronic device 1202 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1202 can also be a device, or a portion thereof, having embedded electronics. Examples of the electronic device 1202 with embedded electronics include a passenger vehicle, industrial equipment, a refrigerator or other home appliance, a drone or other unmanned aerial vehicle (UAV), a power tool, or an Internet of Things (IoT) device.

For an electronic device with a wireless capability, the electronic device 1202 includes an antenna 1204 that is coupled to a transceiver 1206 to enable reception or transmission of one or more wireless signals. The integrated circuit 1210 may be coupled to the transceiver 1206 to enable the integrated circuit 1210 to have access to received wireless signals or to provide wireless signals for transmission via the antenna 1204. The electronic device 1202 as shown also includes at least one user I/O interface 1208. Examples of the user I/O interface 1208 include a keyboard, a mouse, a microphone, a touch-sensitive screen, a camera, an accelerometer, a haptic mechanism, a speaker, a display screen, or a projector.

The integrated circuit 1210 may comprise, for example, one or more instances of a microprocessor 1212, a GPU 1214, a memory array 1216, a modem 1218, and so forth. The microprocessor 1212 may function as a central processing unit (CPU) or other general-purpose processor. Some microprocessors include different parts, such as multiple processing cores, that may be individually powered on or off. The GPU 1214 may be especially adapted to process visual-related data for display. If visual-related data is not being rendered or otherwise processed, the GPU 1214 may be fully or partially powered down. The memory array 1216 stores data for the microprocessor 1212 or the GPU 1214. Example types of memory for the memory array 1216 include random access memory (RAM), such as dynamic RAM (DRAM) or static RAM (SRAM); flash memory; and so forth. If programs are not accessing data stored in memory, the memory array 1216 may be powered down overall or by individual areas. The modem 1218 demodulates a signal to extract encoded information or modulates a signal to encode information into the signal. If there is no information to decode from an inbound communication or to encode for an outbound communication, the modem 1218 may be idled to reduce power consumption. The integrated circuit 1210 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1210 may also comprise a system-on-a-chip (SOC). An SOC may integrate a sufficient number of different types of components to enable the SOC to provide computational functionality as a notebook computer, a mobile phone, or another electronic apparatus using one chip, at least primarily. Components of an SOC, like that of an integrated circuit 1210 generally, may be termed cores or blocks of circuitry. A core or block of an SOC may be powered down if not in use, such as by undergoing a power collapse or by being multiplexed onto a power rail having a lower voltage level. Examples of cores or blocks include, in addition to those that are illustrated in FIG. 12, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or blocks, such as a processing or GPU core, may further include multiple internal cores or blocks that can be individually powered.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
a functional logic block including multiple storage units, the functional logic block configured to store functional data in the multiple storage units during a regular operational mode, each storage unit of the multiple storage units comprising:
multiplexer circuitry including a first input configured to receive the functional data, a second input configured to receive scan input data, and a third input configured to receive memory test result data;
a memory block; and
test logic configured to perform a test on the memory block to generate the memory test result data, the test logic configured to retain the memory test result data in the multiple storage units of the functional logic block using the third input of the multiplexer circuitry during a testing mode.

2. The integrated circuit of claim 1, wherein the test logic is configured to cause the memory test result data to be output from the multiple storage units after the test is performed and during the testing mode.

3. The integrated circuit of claim 1, wherein the multiple storage units are physically co-located with the functional logic block on the integrated circuit.

4. The integrated circuit of claim 3, wherein:
the functional logic block is configured to implement functional logic during the regular operational mode, the functional logic comprising modem processing functionality or video processing functionality; and
the functional data comprises modem data or video data.

5. The integrated circuit of claim 1, wherein:
the multiple storage units comprise multiple flip-flops; and
the memory block comprises an array of random access memory (RAM).

6. The integrated circuit of claim 5, wherein the memory test result data characterizes a failure of a memory access operation, the failure indicative of a defect in the array of RAM.

7. The integrated circuit of claim 1, wherein the multiple storage units comprise multiple registers of the functional logic block at least during the testing mode.

8. The integrated circuit of claim 7, wherein:
each register of the multiple registers comprises multiple flip-flops; and
the multiple flip-flops of each register are configurable to operate as a shift register during the testing mode.

9. The integrated circuit of claim 7, wherein the test logic comprises scan test circuitry configured to perform a scan test on the multiple registers of the functional logic block using the second input of the multiplexer circuitry to provide the scan input data.

10. The integrated circuit of claim 7, wherein:
the test logic comprises memory test circuitry configured to perform the test on the memory block;
the memory test result data comprises an address of a failed memory location and output test data from the failed memory location resulting from a performance of the test on the memory block; and
the memory test circuitry includes:
an address buffer configured to store the address of the failed memory location; and
an output data buffer configured to store the output test data resulting from the performance of the test on the memory block.

11. The integrated circuit of claim 10, wherein the memory test circuitry further includes an operation buffer configured to store an indication of a memory task that produced the failed memory location.

12. The integrated circuit of claim 10, wherein the memory test circuitry is configured to transfer, using the third input of the multiplexer circuitry, the address and the output test data to a register of the multiple registers to be retained while the memory test circuitry continues to perform the test on the memory block.

13. The integrated circuit of claim 7, wherein:
each storage unit of the multiple storage units comprises a register of the multiple registers, each register including multiple flip-flops, each flip-flop configured to store one bit of data and including an input node coupled to the multiplexer circuitry; and
the multiplexer circuitry is configured to multiplex the functional data, the scan input data, or the memory test result data to the input node of each flip-flop.

14. The integrated circuit of claim 13, wherein:
the multiplexer circuitry is configured to multiplex to the input node of each flip-flop during the testing mode the scan input data via the second input or the memory test result data via the third input.

15. The integrated circuit of claim 14, wherein the multiplexer circuitry is configured to multiplex to the input node of each flip-flop during the regular operational mode the functional data via the first input.

16. An integrated circuit comprising:
a functional logic block configured to implement processing functionality during a regular operational mode, the functional logic block including:
storage means for storing functional data during the regular operational mode, the storage means comprising:
multiplexer means for multiplexing memory test result data, scan input data, or the functional data to at least one flip-flop of multiple flip-flops;
a memory block configured to hold operational data during the regular operational mode; and
test logic configured to perform a test on the memory block to generate the memory test result data during a testing mode, the test logic including:
control means for retaining the memory test result data in the storage means during the testing mode using the multiplexer means.

17. The integrated circuit of claim 16, wherein:
the storage means further comprises the multiple flip-flops, each flip-flop capable of storing one bit of data; and
the functional logic block comprises actuation means for actuating the multiple flip-flops into multiple registers.

18. The integrated circuit of claim 17, wherein:
the multiplexer means includes a first input, a second input, and a third input; and
the multiplexer means is configured, responsive to the control means, to multiplex to an input node of at least one flip-flop of a register of the multiple registers,
the functional data via the first input during the regular operational mode, or
the scan input data via the second input or the memory test result data via the third input for different testing scenarios during the testing mode.

19. The integrated circuit of claim 16, wherein the control means is configured to transfer the memory test result data from the test logic to the storage means using the multiplexer means, the memory test result data including:
output test data from a failed memory location that is detected based on the test that is performed by the test logic on the memory block; and
an address of the failed memory location.

20. The integrated circuit of claim 19, wherein the test logic is configured to scan out the memory test result data from the storage means using the multiplexer means by activating a scan enable signal after the test logic completes the test on the memory block.

21. The integrated circuit of claim 19, wherein the control means includes multiplexer control means for generating a data selection signal based on a state of a memory fail signal.

22. An integrated circuit comprising:
a functional logic block configured to implement processing functionality, the functional logic block including:
multiple flip-flops, each flip-flop configurable to store one bit of data as part of a register of multiple registers; and
multiplexer circuitry including a first input corresponding to functional data, a second input corresponding to scan input data, a third input corresponding to memory test result data, and an output, the output coupled to the multiple flip-flops,
the functional logic block configured to store the functional data for the processing functionality in the multiple flip-flops via the first input during a regular operational mode;
a memory block configured to hold operational data for the functional logic block during the regular operational mode; and
test logic including memory test circuitry configured to:
perform a test on the memory block during a testing mode;
generate the memory test result data responsive to detection of a memory location failure based on the test; and
retain the memory test result data in the multiple flip-flops, as actuated into the register, via the third input during the testing mode.

23. The integrated circuit of claim 22, wherein:
the memory test result data comprises an address of the memory location failure and output test data from the memory location failure; and
the multiplexer circuitry is configured to multiplex the memory test result data into the register during the testing mode via the third input responsive to at least one of a selection signal or a scan enable signal.

24. The integrated circuit of claim 22, wherein the test logic includes scan test circuitry configured to:
perform a scan test on the multiple registers by applying the scan input data to the multiple flip-flops via the second input.

* * * * *